US010529552B2

United States Patent
Chien et al.

(10) Patent No.: US 10,529,552 B2
(45) Date of Patent: Jan. 7, 2020

(54) METHOD FOR MANUFACTURING A SEMICONDUCTOR DEVICE AND A COATING MATERIAL

(71) Applicant: TAIWAN SEMICONDUCTOR MANUFACTURING CO., LTD., Hsinchu OT (TW)

(72) Inventors: Yu-Ling Chang Chien, Hsinchu (TW); Chien-Chih Chen, Taipei (TW); Chin-Hsiang Lin, Hsinchu (TW); Ching-Yu Chang, Yilang County (TW); Yahru Cheng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/905,501

(22) Filed: Feb. 26, 2018

(65) Prior Publication Data
US 2019/0164746 A1   May 30, 2019

Related U.S. Application Data

(60) Provisional application No. 62/592,195, filed on Nov. 29, 2017.

(51) Int. Cl.
| | | |
|---|---|---|
| H01L 21/02 | (2006.01) |
| H01L 21/311 | (2006.01) |
| C09D 125/06 | (2006.01) |
| C09D 133/12 | (2006.01) |
| C09D 125/16 | (2006.01) |
| H01L 21/027 | (2006.01) |
| H01L 21/768 | (2006.01) |
| H01L 21/033 | (2006.01) |
| C09D 125/18 | (2006.01) |

(52) U.S. Cl.
CPC ...... *H01L 21/02118* (2013.01); *C09D 125/06* (2013.01); *C09D 125/16* (2013.01); *C09D 133/12* (2013.01); *H01L 21/0273* (2013.01); *H01L 21/31111* (2013.01); *H01L 21/31133* (2013.01); *H01L 21/31144* (2013.01)

(58) Field of Classification Search
CPC ......... H01L 21/02118; H01L 21/31111; H01L 21/31133; H01L 21/0273; H01L 21/31144; C09D 125/06; C09D 133/12; C09D 125/16
See application file for complete search history.

(56) References Cited

U.S. PATENT DOCUMENTS

| | | | |
|---|---|---|---|
| 6,287,951 B1 * | 9/2001 | Lucas | H01L 21/76801 257/E21.507 |
| 7,172,960 B2 * | 2/2007 | Natarajan | H01L 21/0276 257/E21.017 |
| 8,796,666 B1 | 8/2014 | Huang et al. | |

(Continued)

*Primary Examiner* — Sonya D. McCall-Shepard
(74) *Attorney, Agent, or Firm* — McDermott Will & Emery LLP (57) ABSTRACT

In a method of manufacturing a semiconductor device, an underlying structure is formed. A surface grafting layer is formed on the underlying structure. A photo resist layer is formed on the surface grafting layer. The surface grafting layer includes a coating material including a backbone polymer, a surface grafting unit coupled to the backbone polymer and an adhesion unit coupled to the backbone polymer.

19 Claims, 8 Drawing Sheets

(56) References Cited

U.S. PATENT DOCUMENTS

| | | | |
|---|---|---|---|
| 9,093,530 B2 | 7/2015 | Huang et al. | |
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 9,785,049 B2 * | 10/2017 | Hatakeyama | G03F 7/0397 |
| 9,835,947 B2 * | 12/2017 | Seino | B81C 1/00031 |
| 9,857,684 B2 | 1/2018 | Lin et al. | |
| 9,859,206 B2 | 1/2018 | Yu et al. | |
| 9,875,892 B2 | 1/2018 | Chang et al. | |
| 2006/0121390 A1 * | 6/2006 | Gonsalves | G03F 7/0397 |
| | | | 430/270.1 |
| 2012/0088188 A1 * | 4/2012 | Trefonas | B81C 1/00031 |
| | | | 430/270.1 |
| 2015/0287592 A1 * | 10/2015 | Park | G03F 7/0002 |
| | | | 438/702 |

* cited by examiner

METHOD FOR MANUFACTURING A SEMICONDUCTOR DEVICE AND A COATING MATERIAL

RELATED APPLICATION

This Application claims priority of U.S. Provisional Patent Application No. 62/592,195 filed on Nov. 29, 2017, the entire contents of which are incorporated herein by reference.

TECHNICAL FIELD

The disclosure relates to methods for manufacturing semiconductor integrated circuits, and more particularly to methods and materials for resist patterning.

BACKGROUND

As the semiconductor industry has progressed into nanometer technology process nodes in pursuit of higher device density, higher performance, and lower costs, challenges from both fabrication and design issues become greater. Lithography operations are one of the key operations in the semiconductor manufacturing process.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The semiconductor devices include interconnect structures that include a plurality of interconnect pattern (line) layers having conductive patterns and interconnecting various features in one portion of the die to other features of the die. The interconnect structures are formed of conductive materials such as metal and the semiconductor devices include several interconnect layers in various embodiments. In some embodiments, the metal interconnect lines connect an array of transistors to other arrays or other features.

The interconnect layer patterns in different layers are also coupled to one another through vias that extend vertically between one or several interconnect layers. The interconnect layer patterns are coupled to external features and can represent bit lines, signal lines, word lines, and various input/output connections in some embodiments. In some embodiments of the disclosure, each of the interconnect structures is formed by a damascene process, in which a layer of inter-metal dielectric (IMD) material is deposited, trenches and vias are formed and filled with conductive material (e.g., copper or aluminum or various alloys) and the surface is planarized by chemical mechanical polishing (CMP), although other patterning techniques are used in other embodiments.

Examples of devices that can benefit from one or more embodiments of the present disclosure are semiconductor devices. The semiconductor devices include a fin field effect transistor (FinFET) and other MOS transistors. Other types of transistors, such as a gate-all-around (GAA) FET, also benefit from the present embodiments. Semiconductor devices may further include a static random access memory (SRAM) and/or other logic circuits, passive components such as resistors, capacitors, and inductors, and active components. The semiconductor device may include a plurality of semiconductor devices (e.g., transistors), which may be interconnected. It is understood, however, that the application should not be limited to a particular type of device, except as specifically claimed.

When a FinFET, which includes a three dimensional fin structure, is utilized, unevenness is caused on an interlayer dielectric (ILD) layer, which affects performance of lithography operations. To address these issues, a multi-layer resist patterning system has been developed.

In the multi-layer resist patterning system, a tri-layer resist patterning system employs a bottom layer, a middle layer and a photo resist layer. As the critical dimension of the patterns continues to shrink, lithographic performances become worse. For example, resist scums, resist peeling, resist pattern collapse are major problems to be solved.

In the present disclosure, an adhesion promotion layer is provided between the photo resist pattern and the middle layer. In particular, when the middle layer is made of a silicon based material, the adhesion promotion layer can improve resist adhesion between the middle layer and the photo resist pattern.

In embodiments of the present disclosure, a tetra-layer (e.g., four layers) system with a surface grafting layer between a photo resist layer and a thin deposited middle layer having a high etching selectivity can provide more etching budget for photo resist compared with a tri-layer system. Furthermore, the surface grafting priming material is expected to provide function such as surface modification and has better conformity for etching loading control compared with a spin-on material.

Figure 1A:
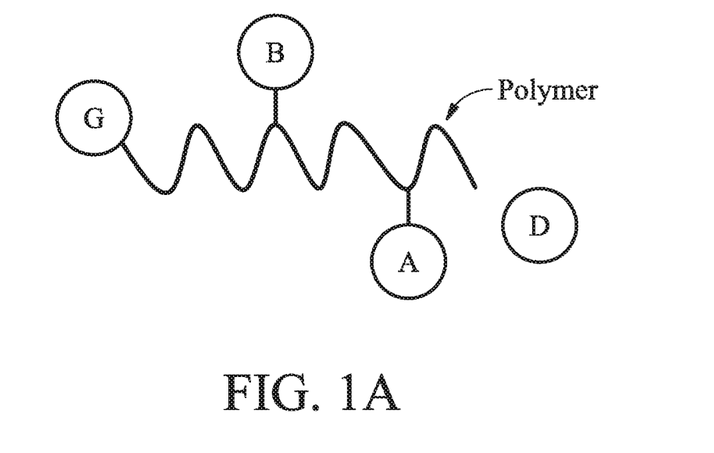
FIGS. 1A and 1B show conceptual structures of a coating material according to embodiments of the present disclosure.
Figure 1B:
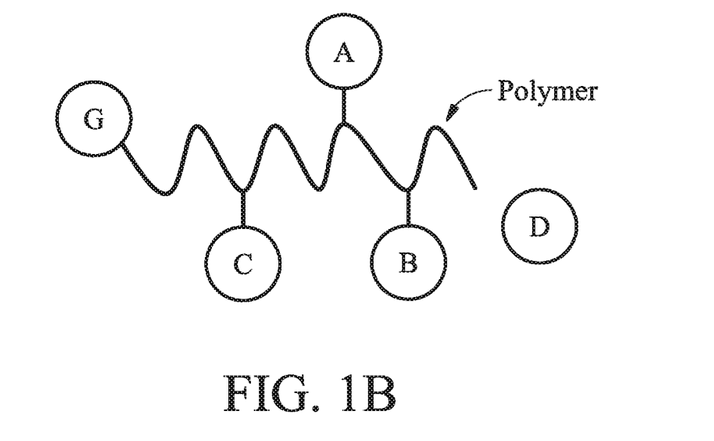
Figure 2A:
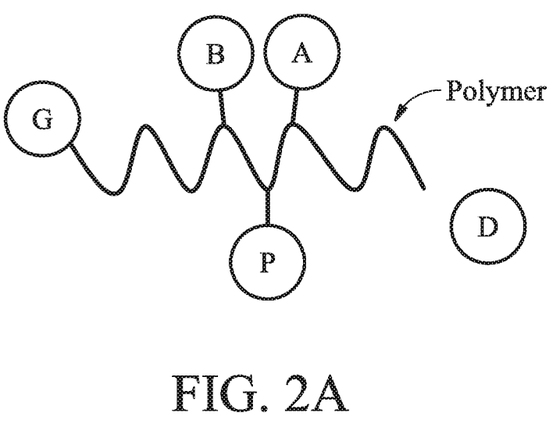
FIGS. 2A and 2B show conceptual structures of a coating material according to embodiments of the present disclosure.
Figure 2B:
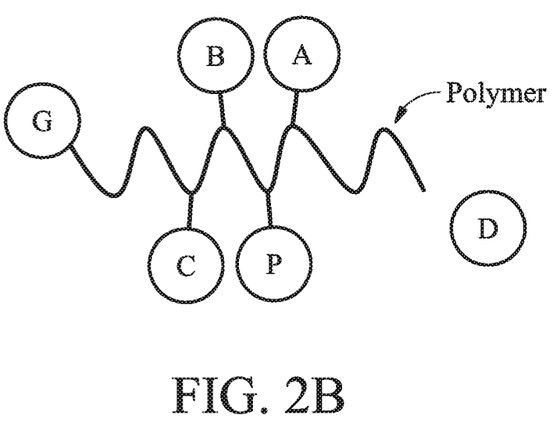

FIGS. 1A and 1B show conceptual structures of a coating material according to embodiments of the present disclosure, when the photo resist is a positive tone photo resist, and FIGS. 2A and 2B show conceptual structures of a coating material according to embodiments of the present disclosure, when the photo resist is a negative tone photo resist.

The adhesion promotion layer is a coating material and includes an organic material formed by a coating method. The coating material includes a backbone polymer, a surface grafting unit coupled to the backbone polymer, and an adhesion unit coupled to the backbone polymer, as shown in FIGS. 1A to 2B.

For both the positive tone photo resist and the negative tone photo resist, the backbone polymer includes at least one polymer selected from the group consisting of poly-methyl methacrylate (PMMA), polystyrene (PS) and polyhydroxystyrene (PHS) in some embodiments. Other organic polymers containing aromatic rings can be used. The backbone polymer includes various functional units coupled thereto. The molecular weight of the backbone polymer is in a range from about 1000 to about 20000 in some embodiments.

One of the functional units is a surface grafting unit G. The surface grafting unit can be self-crosslinked or cross-linked with a surface material of the middle layer for property control. For example, solvent resistance can be improved by the surface grafting unit. The surface grafting unit G includes one selected from the group consisting of —NH, —OH, —SH and —COOH, in some embodiments. In certain embodiments, the surface grafting unit G is coupled to the end of the backbone polymer, as shown in FIGS. 1A to 2B.

Another of the functional units is an adhesion unit A which promotes adhesion strength between the middle layer and the photo resist pattern. The adhesion unit includes one or more units selected from the group consisting of ketones ($R_1$—O—$R_2$), ethers ($R_1$—(C=O)—$R_2$), amides ($R_1$—(C=O)—$NH_2$, or $R_1$—(C=O)—NH—$R_2$) carboxylic acids ($R_1$—COOH) and alcohols ($R_1$—OH) in some embodiments. $R_1$ and $R_2$ independently include H, methyl, ethyl, propyl, isopropyl, butyl, t-butyl, pentyl, cyclopentyl, hexyl, or cyclohexyl. $R_1$ and $R_2$ on each position of the structure can be the same or different. In certain embodiments, the adhesion unit A is coupled to the backbone polymer as a side chain, as shown in FIGS. 1A to 2B.

Figure 3A:
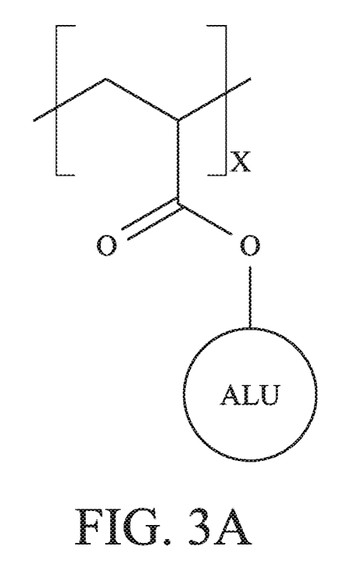
FIGS. 3A, 3B, 3C and 3D show various polarity switching units.
Figure 3B:
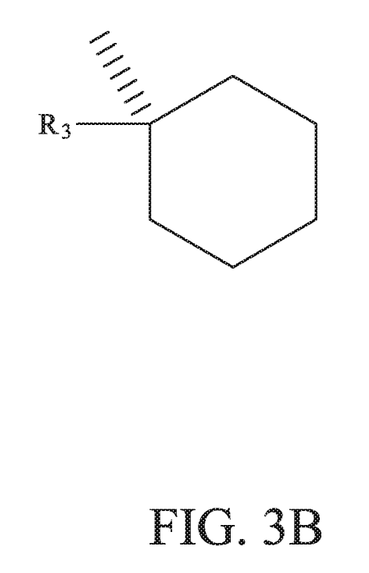
Figure 3C:
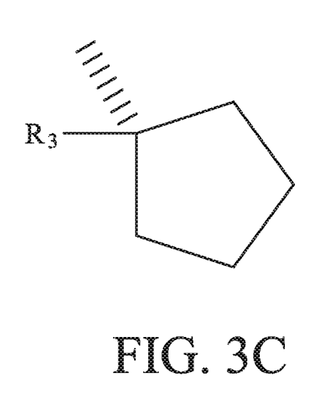
Figure 3D:
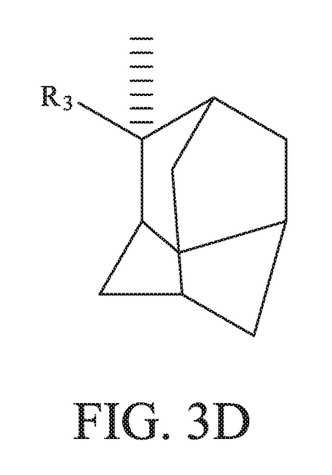

For the coating material used with the negative tone photo resist, as shown in FIGS. 2A and 2B, the coating material further includes a polarity switching unit P coupled to the backbone polymer as a side chain. The polarity switching unit P includes an acid labile unit (ALU). For example, a compound shown in FIG. 3A, 1,2 alkyl-cyclopentyl shown in FIG. 3B, 1,2 alkyl-cyclohexyl shown in FIG. 3C, and/or 1,2 alkyl-admantyl shown in FIG. 3D can be used. $R_3$ in FIGS. 3B-3D includes one of methyl, ethyl, propyl, isopropyl, butyl, t-butyl, pentyl, cyclopentyl, hexyl, or cyclohexyl. In other embodiments, the polarity switching unit is at least one selected from the group consisting of t-BOC protected polyhydroxystyrene, methyl adamantyl methacrylate (MAdMA), ethyl adamantyl methacrylate (EAdMA) and propyl adamantyl methacrylate (PAdMA).

For both the positive tone photo resist and the negative tone photo resist, the coating material further includes an acidic component and/or an acid quencher C coupled to the backbone polymer as a side chain, as shown in FIGS. 1A to 2B. The acidic component includes, for example, triphenylsulfonium, nonaflate and/or triflate. The acid quenchers include compounds such as amines, including polyamines, such as diamines, triamines, or tetraamines, as well as quaternary ammonium compounds, trialkylammonium compounds, amides, ureas, tBOC-blocked amines, and the like. In some embodiments, the acid quencher includes, for example, n-Boc-pyrrole, 1,8-diazabicyclo[5,4,0]undec-7-ene, and/or 1,5-diazabicyclo[4,3,0]non-5-ene. The acidic component and acid quencher can be normal type, thermal-reactive type and/or photo-reactive type.

The coating material further includes one or more assisting organic units B which promote etching resistivity and/or adhesion strength. The assisting organic units B can be coupled to the backbone polymer as a side chain, and include one or more of adamantantyl, benzenyl and/or norbornene.

In some embodiments, the etching resistance group B includes inorganic material, such as silicon, silicon nitride, Ti, TiN, Al, aluminum oxide and SiON. The inorganic material can be included as fine particles.

In addition, in some embodiments, the coating material further includes surfactant and/or fluoro-based compounds D, which can help for coating uniformity and surface tension control. The surfactant and/or fluoro-based compounds D are not coupled to the backbone polymer in some embodiments. The compound D includes one or more of 1H,1H,2H-Perfluoro-1-hexene and 2-(Perfluoroalkyl)ethyl stearate.

The backbone polymer with the aforementioned functional units and/or one or more additives are dissolved into a solvent. The solvents include, for example: glycol ethers such as 2-methoxyethyl ether(diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; cellosolve esters such as methyl cellosolve acetate; aromatic hydrocarbons such as toluene and xylene; and ketones such as acetone, methyl-ethyl ketone, cyclohexanone and 2-heptanone. Two or more kinds of solvents can be used. The amount of the solvent is a range from about 80 wt % to 99 wt %, based on the total weight of the coating material, in some embodiments. The viscosity of the coating material is in a range from about 0.2 centipoise to about 3000 centipoise in some embodiments. The amount of the surface grafting unit G is in a range from about 10 wt % to 90 wt % with respect to the total of the surface grafting unit G, the adhesion unit A, the polarity switching unit P, the assisting organic unit B, the acidic component and/or an acid quencher C, and surfactant and/or fluoro-based compounds D (G+A+P+B+C+D). The amount of the adhesion unit A is in a range from about 10 wt % to 90 wt % with respect to the total G+A+P+B+C+D. The amount of the polarity switching unit P, the assisting organic unit B, the acidic component and/or an acid quencher C, and surfactant and/or fluoro-based compounds D is respectively in a range from about 0 wt % to 80 wt % with respect to the total G+A+P+B+C+D.

FIGS. 4-8 show various stages of manufacturing a semiconductor device according to an embodiment of the present disclosure. It is understood that additional operations can be provided before, during, and after processes shown by FIGS. 4-8, and some of the operations described below can be replaced or eliminated, for additional embodiments of the method. The order of the operations/processes may be interchangeable.

The semiconductor devices include interconnect structures that include a plurality of interconnect pattern (line) layers having conductive patterns and a plurality of contact holes/vias for connecting various features in one portion/feature of a semiconductor chip (die) to other portions/features of the chip. The interconnect and via structures are formed of conductive materials such as metal, and the semiconductor devices include several interconnect layers in various embodiments.

The interconnect layer patterns in different layers are also coupled to one another through vias that extend vertically between one or several interconnect layers. The interconnect layer patterns are coupled to external features and can represent bit lines, signal lines, word lines, and various input/output connections in some embodiments. In some embodiments of the disclosure, each of the interconnect structures is formed by a damascene process, in which a layer of inter-metal dielectric (IMD) material is deposited, trenches and vias are formed and filled with conductive material (e.g., copper or aluminum or various alloys) and the surface is planarized by chemical mechanical polishing (CMP), although other patterning techniques are used in other embodiments. Because of the resolution limit of photolithography processes, multiple patterning lithography processes are used to form densely arranged interconnects and/or vias.

In the lithography operations, flatness of the underlying layer/structure is critical because of a tight focus margin. Accordingly, when the underlying layer/structure is uneven, it is necessary to planarize the unevenness with one or more planarization layers before applying a photo resist.

Figure 4:
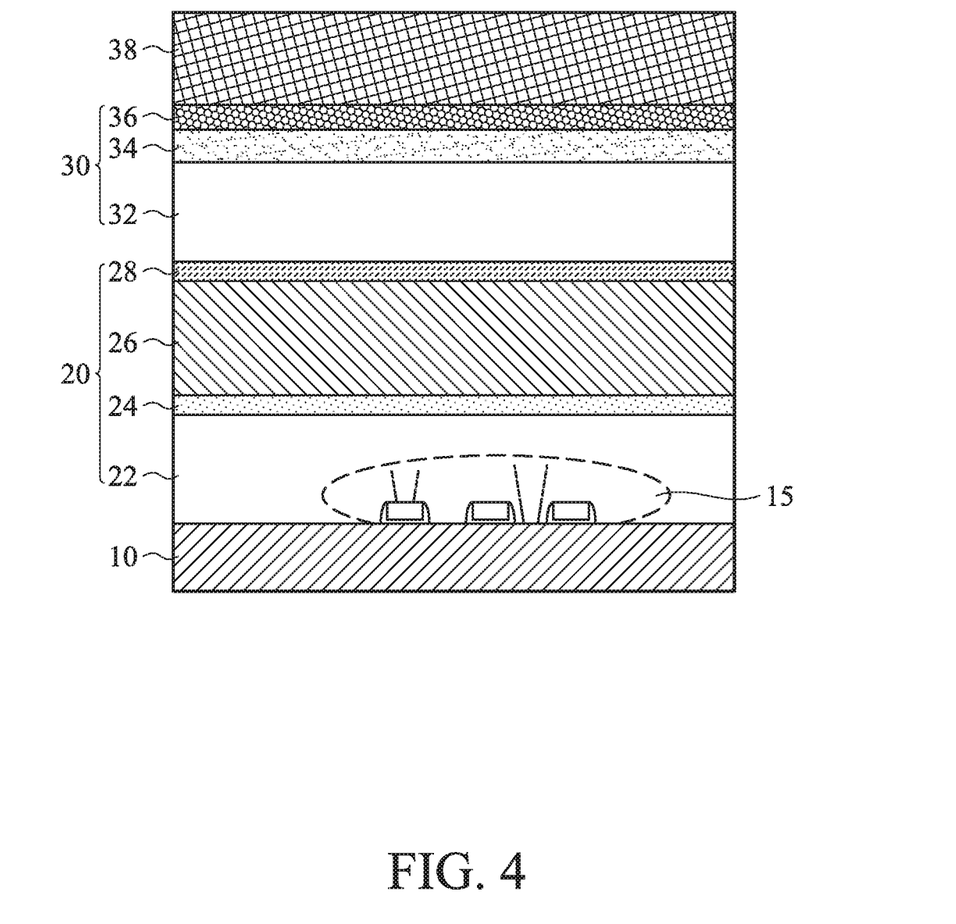
FIG. 4 is one of the various stages of a sequential semiconductor device manufacturing process according to an embodiment of the present disclosure.

As shown in FIG. 4, underlying structures 15 are disposed over an underlying layer. In some embodiments, the underlying layer is a substrate 10. In one embodiment, the substrate 10 is a silicon substrate. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. Amorphous substrates, such as amorphous Si or amorphous SiC, or an insulating material, such as silicon oxide may also be used as the substrate. The substrate may include various regions that have been suitably doped with impurities (e.g., p-type or n-type conductivity).

The underlying structures 15 include various devices, structures, layers and/or elements. Examples of the underlying devices may include static random access memories (SRAMs) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, such as a FinFET, bipolar transistors, high voltage transistors, high frequency transistors, other memory cells, and combinations thereof. The semiconductor device may include a plurality of semiconductor devices (e.g., transistors), which may be interconnected. It is understood, however, that this disclosure is not limited to a particular type of device.

These underlying devices are covered by one or more of first interlayer dielectric (ILD) layers 22. The first interlayer dielectric layer 22 includes silicon oxide, silicon nitride, silicon oxynitride (SiON), SiOCN, fluorine-doped silicate glass (FSG), or a low-k dielectric material, or any other suitable dielectric material. The first interlayer dielectric layer may be formed by chemical vapor deposition (CVD) or other suitable film forming processes. The formed first interlayer dielectric layer may be subjected to a planarization process, such as an etch back process and/or a chemical mechanical polishing process.

After the first interlayer dielectric layer 22 is formed, an etch stop layer 24 is formed over the first interlayer dielectric layer 22. The etch stop layer 24 includes any known etch stop material, including, but not limited to, a silicon oxide, silicon nitride, silicon oxynitride, aluminum oxide, aluminum nitride, aluminum fluoride, titanium nitride, tantalum oxide, magnesium fluoride, and titanium silicon nitride. The thickness of the etch stop layer 24 is in a range from about 1 nm to about 10 nm in some embodiments. The etch stop layer 24 can be formed by CVD, atomic layer deposition (ALD) or any other suitable film forming methods.

Further, a second interlayer dielectric layer 26 is formed over the etch stop layer 24. The second interlayer dielectric 26 is made of a low-k dielectric material in some embodiments. The expression "low-k" material refers to materials with a dielectric constant less than that of $SiO_2$ (about 3.9). Suitable low-k dielectric materials include flowable oxides which are basically ceramic polymers, such as hydrogen silsesquioxane (HSQ). HSQ-type flowable oxides are used for gap filling between metal lines because of their flowability and ability to fill small openings. Additional low-k dielectrics include organic low-k materials, typically having a dielectric constant of about 2.0 to about 3.8. Organic low-k materials include a poly(arylene) ether, BCB (divinylsiloxane bis-benzocyclobutene), and organic-doped silica glasses (OSG) (also known as carbon-doped glasses). Other suitable types of low-k dielectrics are fluorine-doped silicate glasses (FSG) and SiCOH. FSG include dielectrics formed from precursor gases $SiF_4$, $SiH_4$, and $N_2O$ and dielectrics formed from the precursors $SiF_4$, tetraethylorthosilicate (TEOS), and $O_2$. Dielectrics formed from TEOS and $SiF_4$ are known as fluorinated TEOS or FTEOS. The thickness of the second interlayer dielectric layer 26 is in a range from about 10 nm to about 100 nm in some embodiments.

Further, a hard mask layer 28 is formed over the second inter layer dielectric layer. The hard mask layer 28 includes an insulating material, such as a silicon oxide, silicon nitride or a metal based material, such as a TiN or TaN. The thickness of the hard mask layer 28 is in a range from about 1 nm to about 10 nm in some embodiments.

In addition, in some embodiments, an antireflection layer (not shown) is formed over the hard mask layer 28 to improve photolithographic pattern fidelity during a subsequent process step. In certain embodiments, the antireflection layer is a nitrogen-free anti-reflection material comprising an organic material. In other embodiments, the antireflection layer includes TiN. The thickness of the antireflection coating layer is in a range from about 1 nm to about 10 nm in some embodiments. In some embodiments, a TiN layer is used as the hard mask layer and the antireflection layer.

After the hard mask layer 28 (and antireflection coating layer) is formed, a multilayer structure 30 is formed over the hard mask layer 28 (and antireflection coating layer), as shown in FIG. 4. The multilayer structure 30 includes a bottom layer 32, a middle layer 34 and a surface grafting layer 36.

In some embodiments, the bottom layer 32 is made of an organic material. The organic material may include a plurality of monomers or polymers that are not cross-linked. Generally, the bottom layer 32 may contain a material that is patternable and/or have a composition tuned to provide anti-reflection properties. Exemplary materials for the bottom layer 32 include carbon backbone polymers. The bottom layer 32 is used to planarize the structure, as the underlying structure may be uneven depending on the structure of the devices 15 formed on the substrate 10. In some embodiments, the bottom layer 32 is formed by a spin coating process. In other embodiments, the bottom layer 32 is formed by another suitable deposition process. The thickness of the bottom layer 32 is in a range from about 80 nm to about 120 nm in some embodiments.

The middle layer 34 may have a composition that provides anti-reflective properties and/or hard mask properties for the photolithography process. In some embodiments, the middle layer 34 includes a silicon containing layer (e.g., a silicon hard mask material). In some embodiments, the middle layer 34 includes silicon oxide (e.g., spin-on glass (SOG)), silicon nitride, silicon oxynitride, polycrystalline silicon and/or amorphous silicon. The middle layer 34 may be formed by a spin-on coating process, CVD, PVD, and/or other suitable deposition processes.

In other embodiments, the middle layer 34 includes a silicon containing polymer. The silicon containing polymer includes an organic polymer and a cross-linker. In certain embodiments, the silicon containing polymer further includes a chromophone (dye), a photo acid generator, a base quencher and/or fluorocarbon. The middle layer 34 may contain solvent residue. The organic polymer backbone can be polyhydroxystyrene (PHS), poly methyl methacrylate (PMMA), polyether, and combinations thereof, and other organic polymers containing aromatic rings. The middle layer 34 can be a mixture or a bi-layer of silicon-containing polymers. The two or more silicon-containing polymers have backbones having different silicon-containing monomers in some embodiments. The middle layer 34 can be a mixture or a bi-layer of a silicon-containing polymer and an organic polymer not containing silicon. The silicon containing polymer can be deposited by a spin coating method. In some embodiments, two different layers of silicon containing polymer are used, and a more hydrophobic silicon-containing polymer film is formed on a more hydrophilic silicon-containing polymer film.

The middle layer 34 can includes an etching resistance molecule. The etching resistance molecule includes a low Onishi number structure, a double bond, a triple bond, silicon, silicon nitride, Ti, TiN, Al, aluminum oxide, and/or SiON.

The silicon-containing polymer used in the middle layer 34 contains crosslinking groups. The crosslinking groups can be organic, inorganic, or a blend of organic/inorganic groups and can be cleaved by chemical or irradiation processes. The organic and inorganic crosslinking groups can crosslink with a photo resist by heating at 80° C. to 300° C. The structure can be a non-cyclic structure or a cyclic structure. The cyclic structure can be an aromatic, or a non-aromatic ring, which can contain a functional unit, such as —I, —Br, —Cl, —NH$_2$, —COOH, —OH, —SH, —N$_3$, —S(=O)—, alkene, alkyne, imine, ether, vinyl ether, acetal, hemiacetal, ester, aldehyde, ketone, amide, sulfone, acetic acid, cyanide and/or allene. In other embodiments, the crosslinking group is an acid-labile group and the crosslinking bonds can be cleaved by acid-catalyzed reactions. The structure can be a non-cyclic structure or a cyclic structure. The cyclic structure can be an aromatic, and a non-aromatic ring, which can contain a functional group, such as —I, —Br, —Cl, —NH$_2$, —COOH, —OH, —SH, —N$_3$, —S(=O)—, alkene, alkyne, imine, ether, vinyl ether, acetal, hemiacetal, ester, aldehyde, ketone, amide, sulfone, acetic acid, cyanide, allene, imine. Further, in certain embodiments, the crosslinking group is a light sensitive group and the crosslinking bonds can be cleaved by irradiation processes. In some embodiments, the crosslinking group is a C3-C20 alkyl group with at least one light-sensitive functional group, such as an azo group, alkyl halide, imine, alkene, alkyne, peroxide, ketone, aldehyde, allene, aromatic groups or heterocyclic groups. The aromatic structures can be phenyl, napthlenyl, phenanthrenyl, anthracenyl, phenalenyl, and other aromatic derivatives containing one to five-membered rings.

The bottom layer 32 and the middle layer 34 are made of different materials such that the optical properties and/or etching properties of the bottom layer 32 and the middle layer 34 are different from each other. When a polymer is used, the silicon concentration in the middle layer 34 is about 40 mol % or more in some embodiments, and is in a range from about 40 mol % to about 60 mol % in other embodiments.

After the middle layer 34 is formed, the surface grafting layer 36 is formed over the middle layer 34. The coating material as explained above is spin-coated on the middle layer 34. The thickness of the surface grafting layer 36 is in a range from about 1 nm to about 10 nm in some embodiments, and is in a range from about 2 nm to about 5 nm in other embodiments. After spin-coating, a baking operation at a substrate temperature in a range from about 80° C. to 300° C. is performed. In some embodiments, after the spin-coating, a rinse step is applied to remove additional film of the surface grafting layer 36 which is not coupled to (surface-grafted with) the middle layer 34 such that a monolayer of the surface grafting layer 36 remains on the middle layer 34.

Surface grafting layers 36 for a negative tone photo resist have surfaces that are relatively hydrophobic, having a water-droplet contact angle of more than about 40 degrees. Surface grafting layers 36 for a positive tone photo resist have surfaces that are relatively hydrophilic, having a water-droplet contact angle of less than about 40 degrees after the exposure.

Then, a photo resist layer 38 is formed over the surface grafting layer 36, as shown in FIG. 4. The photo resist for the photo resist layer 38 is a chemically amplified photo resist and can be a positive tone photo resist or a negative tone photo resist. After the photo resist is spin coated on the surface grafting layer 36, a baking operation at a substrate temperature in a range from about 80° C. to 120° C. is performed in some embodiments.

Next, the photo resist layer 38 is exposed with an exposure light/beam through a photo mask. The exposure light/beam can be deep ultra violet (DUV) light, such as KrF excimer laser light and ArF excimer laser light, extreme ultra violet (EUV) light having a wavelength around 13.5 nm, an X-ray, and/or electron beam. In some embodiments, multiple exposure processes are applied.

Figure 5:
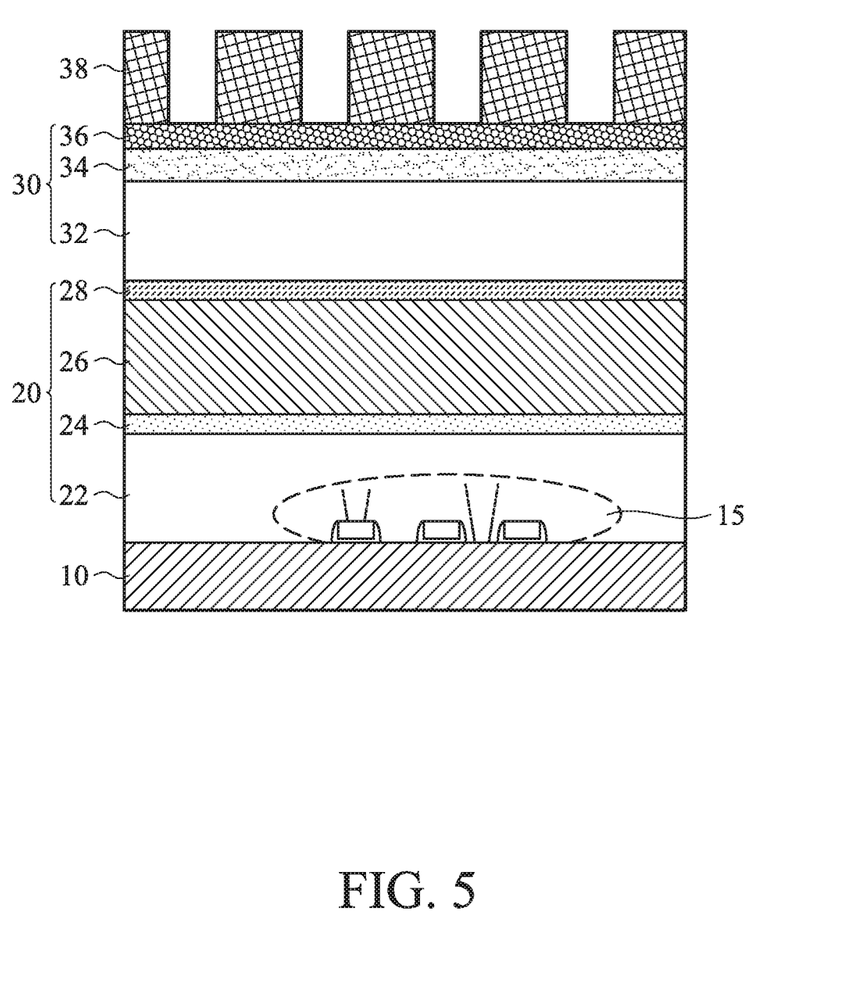
FIG. 5 is one of the various stages of a sequential semiconductor device manufacturing process according to an embodiment of the present disclosure.

FIG. 5 shows a cross section after the exposed resist is baked (post-exposure bake) and developed by a developing solution and a post-baking process is performed. When a positive tone chemically amplified resist is used, acid generated by the exposure light from a photo acid generator (PAG) in the photo resist cleaves acid-cleavable polymers in the photo resist during the post-exposure baking. After the acid cleaves the polymer, the polymer becomes more hydrophilic (i.e., soluble in an aqueous developer). After the polymer becomes more hydrophilic, the polymer cannot be dissolved by organic solvent, for example, normal butyl acetate, but can be dissolved by a basic solution, for example, 2.38% tetramethylammonium hydroxide (TMAH) solution.

When a negative tone chemically amplified resist is used, acid generated by the exposure light from a photo acid generator (PAG) in the photo resist catalyzes a cross-linking reaction of acid catalyzed cross linkable polymer in the photo resist or cauess polymeric pinacol in the photo resist to undergo pinacol rearrangement, during the post-exposure baking. After the polymer cross linking or the undergoing of pinacol rearrangement, the polymers become more hydrophobic. After the polymer become more hydrophobic, the polymers are not dissolved by a basic developing solution, for example, 2.38% TMAH solution.

Since the surface grafting layer 36 is not photo-sensitive (not a photo resist), the developed patterns of the photo resist layer 38 are formed on the surface grafting layer and upper surfaces of the surface grafting layer 36 are exposed where no resist patterns exist. Further, because the surface grafting units of the surface grafting layer 36 can cross-link with the surface of the middle layer 34, photo resist pattern peeling and/or collapse problems can be prevented, even when the resist pattern dimension (e.g., line width) becomes small, e.g., in a range from about 3 nm to about 7 nm. Moreover, due to the acidic component (positive tone resist) or the acid quencher (negative tone resist), it is possible to prevent resist scum at the bottom of the resist patterns.

Figure 6:
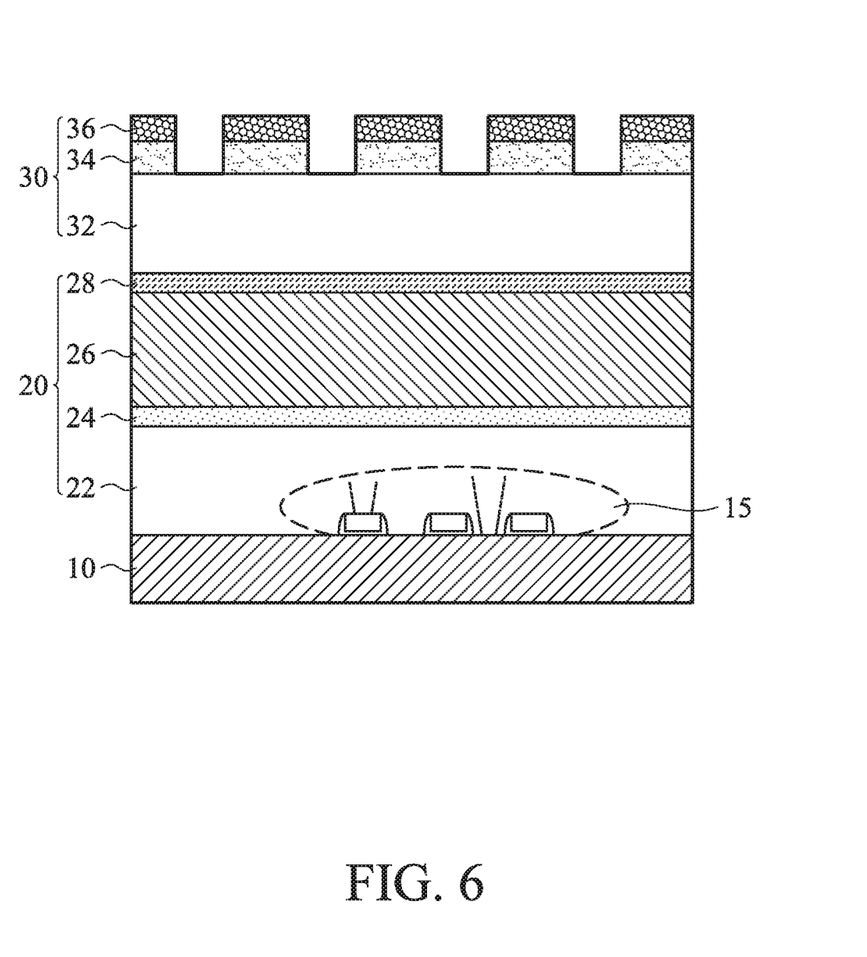
FIG. 6 is one of the various stages of a sequential semiconductor device manufacturing process according to an embodiment of the present disclosure.

After the photo resist layer is patterned, the surface grafting layer 36 and the middle layer 34 are patterned by using one or more etching operations, using the patterned photo resist layer as an etching mask, as shown in FIG. 6. After the patterning operation(s), the photo resist layer 38 is removed.

Figure 7:
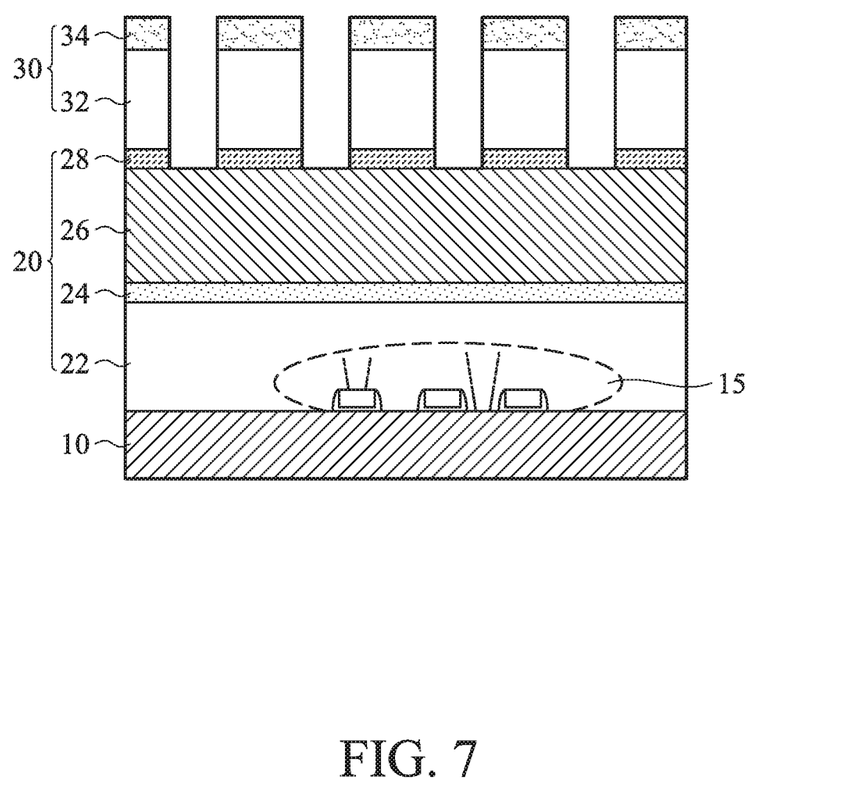
FIG. 7 is one of the various stages of a sequential semiconductor device manufacturing process according to an embodiment of the present disclosure.

Further, in some embodiments, as shown in FIG. 7, the bottom layer 32 and the hard mask layer 28 are patterned using appropriate etchants and etching operations for each layer, and the surface grafting layer 36 is removed. In some embodiments, after the surface grafting layer 36 is removed, the bottom layer 32 and the hard mask layer 28 are patterned by using the patterned middle layer 34 as an etching mask. In other embodiments, during the etching of the bottom layer 32 and the hard mask layer 28, the surface grafting layer 36 is removed when the bottom layer 32 and the surface grafting layer 36 are made of organic materials. After the patterning operation(s), the middle layer 34 and the bottom layer 32 are removed.

Figure 8:
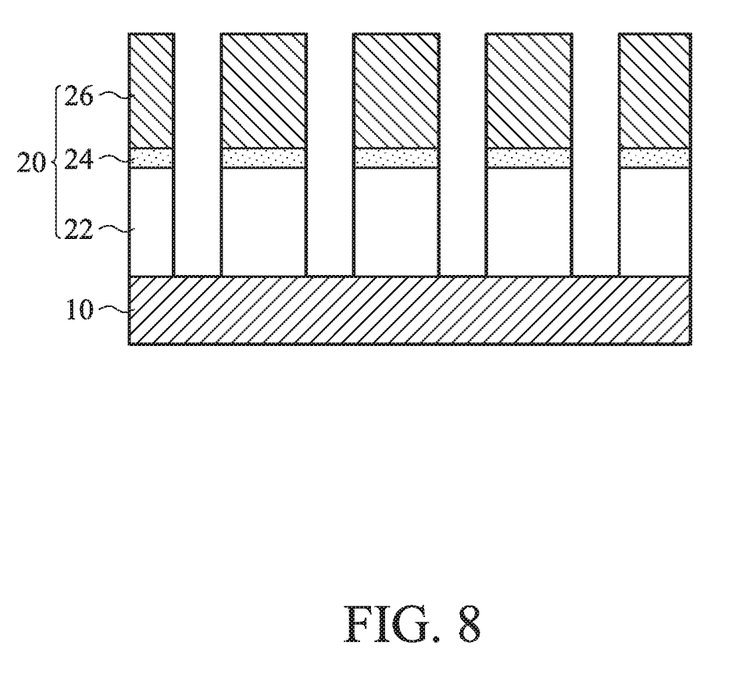
FIG. 8 is one of the various stages of a sequential semiconductor device manufacturing process according to an embodiment of the present disclosure.

Subsequently, by using the patterned hard mask 28 as an etching mask, the second interlayer dielectric layer 26, the etch stop layer 24 and the first interlayer dielectric layer 22 are patterned by appropriate etching operations, as shown in FIG. 8. After the patterning operation(s), the hard mask layer 28 is removed.

Then, the patterns (e.g., through-hole patterns) are filled by conductive material, such as Al, Cu, W, Co, or Ni. A conductive material is deposited by CVD, ALD, PVD, electroplating or any other suitable film formation method, and the deposited conductive material is subsequently planarized by a CMP operation or etch-back operation. It is understood that the structure shown in FIG. 8 undergoes further CMOS processes to form various features such as interconnect vias, interconnect metal layers, passivation layers, etc.

The various embodiments or examples described herein offer several advantages over the existing art. In the present disclosure, by using a surface grafting layer, it is possible to prevent resist pattern peeling and/or collapse even when the resist pattern dimension (e.g., line width) are small. Further, it is possible to improve pattern size control in the lithographic and etching operations.

According to one aspect of the disclosure, a coating material includes a coating material includes a backbone polymer, a surface grafting unit coupled to an end of the backbone polymer, and an adhesion unit different from the surface grafting unit and coupled to the backbone polymer as a side chain. In one or more of the foregoing or following embodiments, the surface grafting unit includes one selected from the group consisting of —NH, —OH, —SH and —COOH. In one or more of the foregoing or following embodiments, the surface grafting unit is —SH. In one or more of the foregoing or following embodiments, the adhesion unit includes one or more units selected from the group consisting of ketones, ethers, amides, carboxylic acids and alcohols. In one or more of the foregoing or following embodiments, the adhesion unit is coupled to the backbone polymer as a side chain. In one or more of the foregoing or following embodiments, the backbone polymer includes at least one selected from the group consisting of poly-methyl methacrylate (PMMA), polystyrene (PS) and polyhydroxystyrene (PHS). In one or more of the foregoing or following embodiments, the coating material further includes a polarity switching unit coupled to the backbone polymer as a side chain. The polarity switching unit is at least one selected from the group consisting of t-BOC protected polyhydroxystyrene, methyl adamantyl methacrylate (MAdMA), ethyl adamantyl methacrylate (EAdMA) and propyl adamantyl methacrylate (PAdMA). In one or more of the foregoing or following embodiments, the coating material further includes an acidic component or an acid quencher coupled to the backbone polymer as a side chain. In one or more of the foregoing or following embodiments, the coating material further includes a surfactant.

In accordance with another aspect of the present disclosure, in a method of manufacturing a semiconductor device, an underlying structure is formed. A surface grafting layer is formed on the underlying structure. A photo resist layer is formed on the surface grafting layer. The surface grafting layer includes a coating material. The coating material includes a backbone polymer, a surface grafting unit coupled to an end of the backbone polymer, and an adhesion unit different from the surface grafting unit and coupled to the backbone polymer as a side chain. In one or more of the foregoing or following embodiments, the surface grafting unit includes one selected from the group consisting of —OH, —COOH, —NH and —SH. In one or more of the foregoing or following embodiments, the adhesion unit is coupled to the backbone polymer as a side chain and includes one or more units selected from the group consisting of ketones, ethers, amides, carboxylic acids and alcohols. In one or more of the foregoing or following embodiments, the backbone polymer includes at least one selected from the group consisting of poly-methyl methacrylate (PMMA), polystyrene (PS) and polyhydroxystyrene (PHS). In one or more of the foregoing or following embodiments, the photo resist layer includes a negative tone photo resist, the coating material further comprises a polarity switching unit coupled to the backbone polymer as a side chain, and the polarity switching unit is at least one selected from the group consisting of t-BOC protected polyhydroxystyrene, methyl adamantyl methacrylate (MAdMA), ethyl adamantyl methacrylate (EAdMA) and propyl adamantyl methacrylate (PAdMA). In one or more of the foregoing or following embodiments, the coating material further comprises an acidic component or an acid quencher coupled to the backbone polymer as a side chain.

In accordance with another aspect of the present disclosure, in a method of manufacturing a semiconductor device, an underlying structure is formed. A first layer is formed on the underlying structure. A second layer is formed on the first layer and the second layer includes a silicon based material. A surface grafting layer is formed on the second layer. A photo resist layer is formed on the surface grafting layer. The surface grafting layer includes a coating material. The coating material includes a backbone polymer, a surface grafting unit coupled to an end of the backbone polymer, and an adhesion unit different from the surface grafting unit and coupled to the backbone polymer as a side chain. In one or more of the foregoing or following embodiments, the photo resist layer is patterned, thereby forming a resist pattern. The surface grafting layer and the second layer are etched by using the resist pattern as an etching mask. In one or more of the foregoing or following embodiments, the silicon based material includes silicon oxide. In one or more of the foregoing or following embodiments, the silicon based material includes a silicon-containing polymer. In one or more of the foregoing or following embodiments, wherein a thickness of the surface grafting layer is in a range from 1 nm to 10 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming an underlying structure;
   forming a surface grafting layer on the underlying structure; and
   forming a photo resist layer on the surface grafting layer, wherein the surface grafting layer includes a coating material comprising:
   a backbone polymer;
   a polarity switching unit coupled to the backbone polymer as a side chain;
   a surface grafting unit coupled to an end of the backbone polymer; and
   an adhesion unit different from the surface grafting unit and coupled to the backbone polymer as a side chain.

2. The method of claim 1, wherein the surface grafting unit includes one selected from the group consisting of —OH, —COOH, —NH and —SH.

3. The method of claim 2, wherein the adhesion unit is coupled to the backbone polymer as a side chain.

4. The method of claim 1, wherein the backbone polymer includes at least one selected from the group consisting of poly-methyl methacrylate (PMMA), polystyrene (PS) and polyhydroxystyrene (PHS).

5. The method of claim 1, wherein:
   the photo resist layer includes a negative tone photo resist, and
   the polarity switching unit is at least one selected from the group consisting of t-BOC protected polyhydroxystyrene, methyl adamantyl methacrylate (MAdMA), ethyl adamantyl methacrylate (EAdMA) and propyl adamantyl methacrylate (PAdMA).

6. The method of claim 1, wherein the coating material further comprises an acidic component or an acid quencher coupled to the backbone polymer as a side chain.

7. A method of manufacturing a semiconductor device, the method comprising:
   forming an underlying structure;
   forming a first dielectric layer on the underlying structure;
   forming an etch stop layer on the first dielectric layer, the etch stop layer including a silicon based material;
   forming a second dielectric layer on the etch stop layer;
   forming a surface grafting layer on the second dielectric layer; and
   forming a photo resist layer on the surface grafting layer, wherein the surface grafting layer includes a coating material comprising:
   a backbone polymer;
   a surface grafting unit coupled to an end of the backbone polymer; and
   an adhesion unit different from the surface grafting unit and coupled to the backbone polymer as a side chain.

8. The method of claim 7, further comprising:
   patterning the photo resist layer, thereby forming a resist pattern; and
   etching the surface grafting layer and the etch stop layer by using the resist pattern as an etching mask.

9. The method of claim 7, wherein the silicon based material includes silicon oxide.

10. The method of claim 7, wherein a thickness of the surface grafting layer is in a range from 1 nm to 10 nm.

11. The method of claim 3, wherein the adhesion unit includes one or more units selected from the group consisting of ketones, ethers, amides, carboxylic acids and alcohols.

12. The method of claim 1, wherein the coating material further comprises a surfactant.

13. The method of claim 7, wherein the surface grafting unit includes one selected from the group consisting of —NH, —OH, —SH and —COOH.

14. The method of claim 7, wherein the adhesion unit is coupled to the backbone polymer as a side chain and includes one or more units selected from the group consisting of ketones, ethers, amides, carboxylic acids and alcohols.

15. The method of claim 7, wherein the backbone polymer includes at least one selected from the group consisting of poly-methyl methacrylate (PMMA), polystyrene (PS) and polyhydroxystyrene (PHS).

16. The method of claim 7, wherein the coating material further comprises a polarity switching unit coupled to the backbone polymer as a side chain, wherein the polarity switching unit is at least one selected from the group consisting of t-BOC protected polyhydroxystyrene, methyl adamantyl methacrylate (MAdMA), ethyl adamantyl methacrylate (EAdMA) and propyl adamantyl methacrylate (PAdMA).

17. The method of claim 7, wherein the coating material further comprises an acidic component or an acid quencher coupled to the backbone polymer as a side chain.

18. The method of claim 7, wherein the coating material further comprises a surfactant.

19. A method of manufacturing a semiconductor device, the method comprising:
    forming an underlying structure;
    forming a first dielectric layer over the underlying structure;
    forming a silicon nitride layer on the first dielectric layer;
    forming a second dielectric layer on the silicon nitride layer;
    forming a first hard mask layer on the second dielectric layer;
    forming a bottom layer on the hard mask layer;
    forming a middle layer on the bottom layer;
    forming a surface grafting layer on the middle layer;
    forming a photo resist layer on the surface grafting layer;
    patterning the photo resist layer, thereby forming a resist pattern; and
    etching the surface grafting layer and the middle layer by using the resist pattern as an etching mask,
    wherein the surface grafting layer includes a coating material comprising:
        a backbone polymer;
        a surface grafting unit coupled to an end of the backbone polymer; and
        an adhesion unit different from the surface grafting unit and coupled to the backbone polymer as a side chain.

* * * * *